United States Patent [19]

Rolfson

[11] Patent Number: 5,091,290
[45] Date of Patent: Feb. 25, 1992

[54] PROCESS FOR PROMOTING ADHESION OF A LAYER OF PHOTORESIST ON A SUBSTRATE HAVING A PREVIOUS LAYER OF PHOTORESIST

[75] Inventor: J. Brett Rolfson, Boise, Id.

[73] Assignee: Micron Technology, Inc., Boise, Id.

[21] Appl. No.: 620,752

[22] Filed: Dec. 3, 1990

[51] Int. Cl.⁵ .............................................. G03C 1/76
[52] U.S. Cl. .................................... 430/327; 430/330; 430/954
[58] Field of Search ............... 430/317, 324, 325, 327, 430/330, 954

[56] References Cited

U.S. PATENT DOCUMENTS 3,860,424  1/1975  Johnson ........................... 430/139
4,411,735  10/1983  Belani ............................... 430/317

Primary Examiner—Charles L. Bowers, Jr.
Assistant Examiner—Kathleen Duda
Attorney, Agent, or Firm—Robert A. de Groot; Stephen A. Gratton

[57] ABSTRACT

A process for promoting photoresist adhesion on a semiconductor wafer having a previously applied photoresist layer. The process is adapted for semiconductor manufacture in which a first photoresist layer has been applied to the wafer and in which a second photoresist layer must be adhered to the first photoresist layer and to the substrate of the wafer. The process includes a steps of: baking the first photoresist layer, applying a liquid mixture including solvents to soften the first photoresist layer and an adhesion promotor for the substrate, spin drying the wafer, and applying a second photoresist layer. In an illustrative embodiment of the invention, the liquid mixture includes acetone, n-butyl acetate (NBA), and hexamethyldisilazane (HMDS) combined in a ratio of 1:1:1.

15 Claims, 1 Drawing Sheet

PROCESS FOR PROMOTING ADHESION OF A LAYER OF PHOTORESIST ON A SUBSTRATE HAVING A PREVIOUS LAYER OF PHOTORESIST

FIELD OF THE INVENTION

This invention is related to the fabrication of semiconductor devices. More specifically, it is related to a novel process for promoting adhesion of a photoresist layer on a substrate having a previously applied layer of photoresist.

BACKGROUND OF THE INVENTION

An electronic circuit is chemically and physically integrated into a substrate such as a wafer by patterning regions in the substrate and by patterning layers on the substrate. These regions and layers can be conductive for conductor and resistor fabrication, or insulative, for insulator and capacitor fabrication. They can also be of differing conductivity types, which is essential for transistor and diode fabrication. Degrees of resistance, capacitance, or conductivity are controllable, as are the physical dimensions and locations of the patterned regions and layers, making circuit integration possible. Fabrication can be quite complex and time consuming and, therefore, expensive. It is thus a continuing quest of those in the semiconductor fabrication business to reduce fabrication times and costs of such devices in order to increase profits. Any simplified processing steps or combination of processes at a single step becomes a competitive advantage.

One application where a process simplification is desirable is in the application of a photoresist layer to a substrate and, particularly, to a substrate on which an existing layer of photoresist has been formed in certain areas or on various semiconductor devices formed on the substrate. In a photoresist process, a substrate may be masked with a patterned photoresist and then etched. This is often done several times. An adhesion promoter such as hexamethyldisilazane (HMDS) may be applied in the form of a vapor prime to promote adhesion of the photoresist to the substrate.

In general, even with the use of an adhesion promoter such as (HMDS), however, it is often difficult to adhere a subsequent layer of photoresist to a layer which has been previously coated with photoresist. Such a double layer photoresist scheme may exist, for instance, for certain semiconductor implant layers where the first resist acts as an implant stop for the area beneath it, and the second layer acts as a stop for a larger area. Such a scheme may be used, for instance, for complimentary metal oxide semiconductor (CMOS) parts in order to implement an N-channel field implant mask.

In order to provide for adhesion of a subsequent photoresist layer, a number of process steps and separate pieces of equipment are required. FIG. 1 shows a representative prior art process sequence. As shown, a semiconductor wafer is initially patterned with a photoresist. The wafer is then baked to toughen or harden the photoresist. Baking is followed by a dip in solvents to soften the photoresist. The wafer is then rinsed and dried. This is followed by another bake which is not as extreme as the first bake but functions to slightly harden the photoresist after the solvent treatment. Each of these steps requires a separate piece of process equipment, each of which is common in the art. Following these steps, an adhesion promotor such as (HMDS) is applied to the wafer by vapor deposition. A second layer of photoresist layer is then applied.

The process of the invention eliminates several of these preparatory steps and pieces of equipment and allows a subsequent layer of photoresist to be applied to a wafer in a single step utilizing a single piece of equipment.

SUMMARY OF THE INVENTION

In accordance with the present invention, a novel process for applying photoresist to a substrate having a previously applied photoresist layer is provided. The process simply stated involves the application of a liquid mixture containing solvent chemicals such as acetone and n-butyl acetate (NBA) and an adhesion promotor such as (HMDS), prior to application of a subsequent layer of photoresist. In general, the solvents function to soften the existing layer of photoresist to provide a more receptive surface for the subsequent layer of photoresist. At the same time, the adhesion promotor, such as (HMDS), functions to provide an adhesion promotor for the second layer of photoresist to the substrate.

In an illustrative embodiment of the invention, a mixture of solvents and the adhesion promotor (HMDS) are applied to the surface of a wafer as a "puddle prime". The wafer is then spin dried, and the second layer of photoresist is applied. The solvent mixture, substrate adhesion promotor, and photoresist may be applied to the wafer by a photoresist coater apparatus which includes a nozzle for dispensing these chemicals in liquid form directly onto the surface of the wafer.

Other objects, advantages, and capabilities of the present invention will become more apparent as the description proceeds.

DETAILED DESCRIPTION OF THE INVENTION

Figure 2:
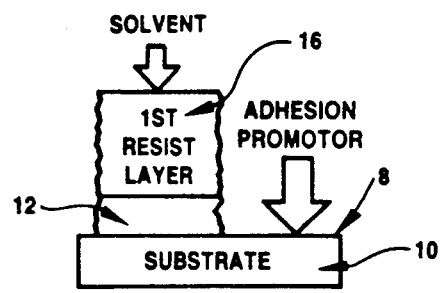
FIG. 2 is an enlarged side elevation view of a portion of a semiconductor wafer having a layer of photoresist and showing application of a mixture of solvents and substrate adhesion promotor in accordance with the invention.

Referring now to FIG. 2, a portion of a semiconductor wafer is shown. A semiconductor wafer 8 typically includes a substrate 10 on which a plurality of micro devices 12 have been formed. The wafer substrate 10 is typically formed of a single crystal silicon material, but other substrates are possible with this invention, for example, Gallium Arsenide. The micro devices 12 are formed by patterning regions on the substrate 10 and patterning layers on the substrate 10. One such process for forming micro devices 12 and patterning contacts to the devices 12 is photolithography. This well known process is used to print masks on a wafer 8. It involves a photosensitive emulsion (photoresist) and selective etching techniques which are analogous to commercial lithography. In general, during photolithography, the wafer 8 is first coated with a photoresist, aligned and exposed to provide a latent image, developed to produce a pattern, and then The photoresist is resistant to etchants once processing is completed. Areas covered with photoresist are not affected by the etchant and can be used to pattern the wafer to produce micro devices and conduction paths for integrated circuits.

Figure 1:
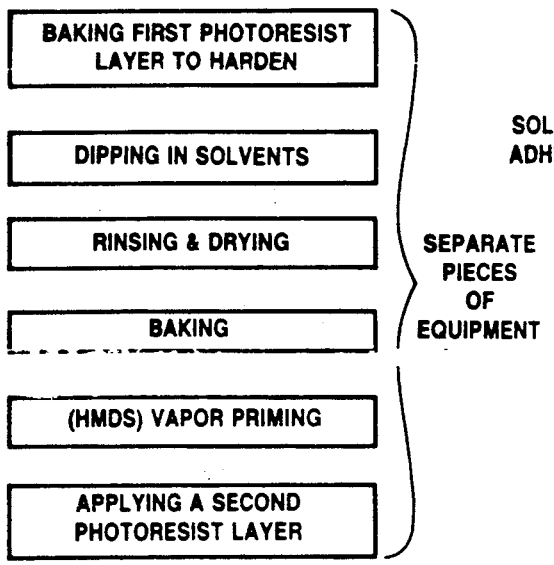
FIG. 1 is a block diagram showing a prior art sequence of steps for applying photoresist to a semiconductor wafer having a previously applied photoresist layer.

An adhesion promotor, such as (HMDS), is typically applied to the wafer substrate 10 in order to promote adhesion of the photoresist. In general, (HMDS) is a silicon-based substance which is attracted to the silicon of the wafer substrate 10. It thus works very well for promoting adhesion of photoresist to a substrate 10 formed of silicon. It does not, however, work as well in promoting adhesion of photoresist to a previously photoresisted surface. This has necessitated the prior art sequence shown in FIG. 1 and discussed previously for applying a second layer of photoresist to an existing first layer of photoresist.

Figure 4:
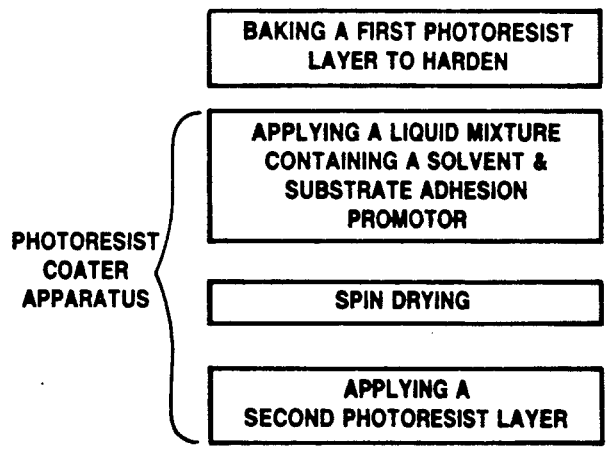
FIG. 4 is a block diagram showing a sequence of steps for applying photoresist to a semiconductor wafer in accordance with the invention.

In general, the process of the invention is an improvement over this process and is adapted to apply a second layer 14 of photoresist to a previously applied first layer 16 of photoresist and to the substrate 10 of the semiconductor wafer 8. The process of the invention is summarized in FIG. 4 and includes the steps of:

1. baking a first photoresist layer 16 formed on a substrate 10 to toughen the first photoresist layer 16;
2. applying a liquid mixture containing a solvent to soften the first photoresist layer 16 for reception of the second photoresist layer and also containing an adhesion promotor for reception of the second photoresist layer to the- substrate 10;
3. spin drying the wafer; and
4. applying a second photoresist layer 14 to the first photoresist layer 16 and to the substrate 10. Steps 2, 3, and 4 can be performed on a single piece of 10 equipment.

Figure 5:
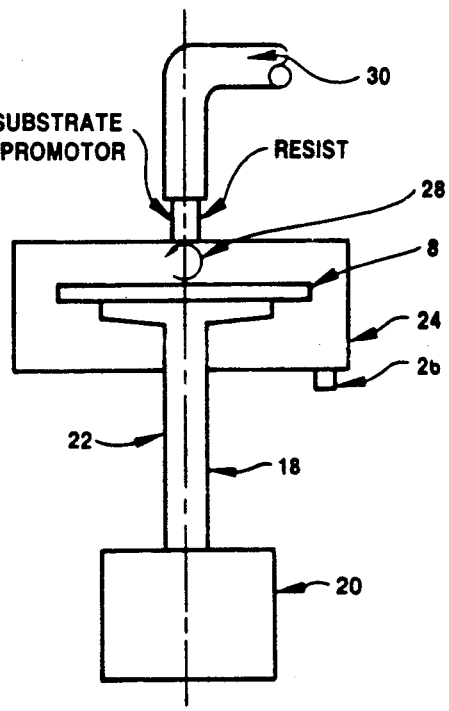
FIG. 5 is a schematic view of a photoresist coater apparatus for applying a solvent mixture, adhesion promotor, and photoresist in accordance with the invention.

One such suitable piece of equipment is the photoresist coater apparatus 18 which is shown schematically in FIG. 5. The photoresist coater apparatus 18 includes an electric drive motor 20, a drive shaft 22, a bowl portion 24, and a drain 26. A wafer 8 can be placed on a platen 28 attached to the drive shaft 22 and rotated as indicated by arrow 28. A nozzle assembly 30 is coupled to sources for a solvent, adhesion promotor, and photoresist and is mounted to dispense these liquids onto the wafer 8. The wafer 8 may be spun for drying these liquids. Excess fluid may be collected in the bowl portion 24 and drained or recirculated through the drain 26.

A critical step of the invention is the application of a liquid mixture containing a photoresist-softening solvent and an adhesion promotor to the wafer 8. In general, the solvent functions to soften the first layer of photoresist 16 such that it is more receptive to application of the second layer of photoresist 14. At the same time, the adhesion promotor functions to adhere to the substrate 10 so that it is also more receptive to the second layer of photoresist 14. These functions are shown schematically in FIG. 2.

The formulation of the liquid mixture containing a solvent for softening the first layer of photoresist and an adhesion promotor for the substrate is critical to the process of the invention. One such suitable liquid mixture is a mixture of acetone, n-butyl acetate (NBA), and (HMDS) combined in a ratio of 1:1:1. In general, acetone is a more aggressive solvent in this application than (NBA), and this combination gives satisfactory results in combination with the parameters hereinafter disclosed. Other solvents or mixtures of solvents may also be suitable for this application, as long as the solvent functions to soften the first layer of photoresist. Some other suitable solvents can be selected from the class consisting of n-methyl-2-pyrrolidone (NMP), ethylene glycol monoethyl ether acetate (EGMEA), propylene glycol monomethyl ether acetate (PGMEA), xylene, ethyl lactate, or ethyl-3-ethoxy propionate. In general, each of these photoresist solvents is miscible with photoresist and is a suitable spin solvent.

As previously stated, the solvent functions to soften the first layer of photoresist 16 so that it is more receptive to the second layer of photoresist 14. The liquid mixture containing the solvent and adhesion promotor may be applied in liquid form as shown in FIG. 5 directly to the surface of the wafer 8. A puddle prime can thus be formed on the wafer which includes the solvent and adhesion promotor (i.e. 1:1:1 ratio acetone:(NBA):(HMDS)). This liquid mixture may be left on the wafer 8 for a short time (i.e. approximately 5–25 seconds) necessary to soften but not completely remove the first layer of photoresist 16. The wafer 8 can then be spun as shown in FIG. 5 for removing or drying excess liquid. As an example, the wafer 8 may be spun at 300 to 6000 rpm for approximately 5–20 seconds.

Figure 3:
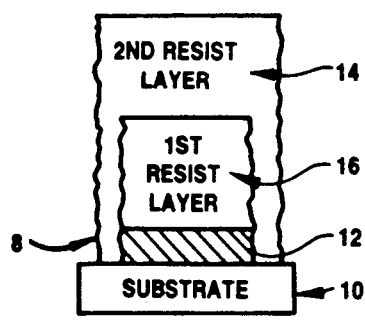
FIG. 3 is an enlarged side elevation view of a portion of a semiconductor wafer showing application of multiple layers of photoresist in accordance with the invention.

After the wafer 8 has been spun dried, the second photoresist layer 14 can be applied to form the structure shown in FIG. 3. As with the liquid mixture, the photoresist can be applied on the photoresist coater apparatus 18 shown in FIG. 5.

The invention thus provides a simple but unobvious process for applying a second layer of photoresist to a previously applied layer of photoresist on a substrate. The process of the invention can be performed on fewer and simpler pieces of equipment than prior art processes and requires fewer steps.

While the process of the invention has been described with reference to a preferred embodiment, as will be apparent to those skilled in the art, certain changes and modifications can be made without departing from the scope of the invention as defined by the following claims.

What is claimed is:

1. A process for applying a second layer of photoresist to a semiconductor wafer having a substrate and a first layer of patterned photoresist comprising:
   baking the wafer to harden the first layer of photoresist;
   applying a liquid mixture onto the wafer, said liquid mixture containing a solvent for the photoresist to softening the first layer of photoresist and an adhesion promotor for the substrate;
   spin drying the wafer; and
   applying a second layer of photoresist,
whereby the solvent provides adhesion promotion for the second layer of photoresist to the first layer of photoresist and the adhesion promotor provides adhesion promotion for the second layer of photoresist to the substrate of the wafer.

2. The process as recited in claim 1 and wherein:

applying the liquid mixture, spin drying the wafer, and applying the second photoresist layer is done on a photoresist coater apparatus.

3. The process as recited in claim 2 and wherein:
the photoresist coater apparatus includes a platen for holding and rotating the wafer and a nozzle for directing the solvent/adhesion promotor mixture and photoresist onto the wafer surface.

4. The process as recited in claim 3 and wherein:
the solvent is a compound miscible with photoresist.

5. The process as recited in claim 3 and wherein:
the solvent is a compound selected from the class consisting of acetone, n-methyl-2-pyrrolidone (NMP), ethylene glycol monoethyl ether acetate (EGMEA), propylene glycol monomethyl ether acetate (PGMEA), ethyl lactate, or ethyl-3-ethoxy propionate.

6. The process as recited in claim 3 and wherein:
the liquid mixture is a combination of acetone, n-butyl acetate (NBA) and hexamethyldisilazane (HMDS) combined in a ratio of 1:1:1.

7. A process for applying a second layer of photoresist to a semiconductor wafer having a substrate and a first layer of patterned photoresist comprising:
A process for applying a second layer of photoresist to a semiconductor wafer having a substrate and a first layer of patterned photoresist comprising:
a. baking the wafer to harden the first layer of photoresist;
b. applying a liquid mixture containing a resist softening solvent and a substrate adhesion promotor to the wafer surface by puddle priming the liquid mixture onto the wafer surface;
c. spin drying the wafer; and
d. applying the second layer of photoresist;
wherein the solvent softens the first layer of photoresist for reception of the second layer of photoresist and the substrate adhesion promotor provides adhesion promotion for the second layer of photoresist to the substrate.

8. The process as recited in claim 7 and wherein:
steps b, c, and d are performed on a photoresist coater apparatus having a platen for holding and rotating the wafer and a nozzle for dispensing the solvent, adhesion promoter, and photoresist onto the surface of the wafer.

9. The process as recited in claim 8 and wherein:
the liquid mixture and the adhesion promotor are puddle primed onto the wafer for about 5-25 seconds, and the wafer is spun for about 5-20 seconds at 300 to about 6000 rpm.

10. The process for applying a second layer of photoresist to a semiconductor wafer having a substrate and a first layer of patterned photoresist comprising:
a. baking the wafer to harden the first layer of photoresist;
b. applying a liquid mixture containing HMDS, acetone, and n-butyl acetate (NBA) combined in a ratio of 1:1:1 by depositing the liquid mixture in a puddle prime onto the wafer surface for a period of from about 5 to 25 seconds;
c. spinning the wafer at from 300 to 6000 rpm for about 5 to 20 seconds; and
d. applying a second layer of photoresist onto the wafer surface;
and wherein steps b, c, and d are done on a photoresist coater apparatus;
whereby the acetone and n-butyl acetate (NBA) soften the first layer of photoresist for reception of the second layer of photoresist and the (HMDS) provides adhesion promotion for the second layer of photoresist to the substrate.

11. The process as recited in claim 10 and wherein:
the acetone is replaced by a different compound that is miscible with photoresist.

12. The process as recited in claim 11 and wherein:
the acetone is replaced by a solvent selected from the class consisting of n-methyl-2-pyrrolidone (NMP), ethylene glycol monoethyl ether acetate (EGMEA), propylene glycol monomethyl ether acetate (PGMEA), ethyl lactate, ethyl-3-ethoxy propionate, or other compounds that are miscible with the photoresist.

13. The process as recited in claim 11 and wherein:
the liquid mixture is puddle primed for about 5-25 seconds and the wafer is rotated for about 5-20 seconds.

14. The process as recited in claim 13 and wherein;
the first photoresist layer acts as an implant stop for an area beneath it and the second photoresist layer acts as a stop for a larger area.

15. The process as recited in claim 14 and wherein:
the process is utilized to implement an N-channel field implant mask.

* * * * *